United States Patent
Naito et al.

(10) Patent No.: US 8,610,224 B2
(45) Date of Patent: Dec. 17, 2013

(54) MEMS ELEMENT AND ELECTRICAL DEVICE USING THE SAME

(75) Inventors: Yasuyuki Naito, Osaka (JP); Philippe Helin, Leuven (BE); Hendrikus Tilmans, Leuven (BE)

(73) Assignees: Panasonic Corporation, Osaka (JP); IMEC, Leuven (BE)

( * ) Notice: Subject to any disclaimer, the term of this patent is extended or adjusted under 35 U.S.C. 154(b) by 0 days.

(21) Appl. No.: 13/590,439

(22) Filed: Aug. 21, 2012

(65) Prior Publication Data

US 2013/0214366 A1 Aug. 22, 2013

(30) Foreign Application Priority Data

Aug. 22, 2011 (JP) .................. 2011-180432

(51) Int. Cl.
  *H01L 23/06* (2006.01)
  *H01L 23/10* (2006.01)
(52) U.S. Cl.
  USPC ..... 257/415; 257/686; 257/729; 257/E23.193
(58) Field of Classification Search
  None
  See application file for complete search history.

(56) References Cited

U.S. PATENT DOCUMENTS

| | | | | |
|---|---|---|---|---|
| 7,245,009 B2 * | 7/2007 | Bosco et al. | ................. | 257/710 |
| 7,298,030 B2 * | 11/2007 | McWilliams et al. | ........ | 257/680 |
| 7,622,324 B2 * | 11/2009 | Enquist et al. | ............... | 438/106 |
| 7,710,768 B2 * | 5/2010 | Naito | ............................ | 365/164 |
| 7,919,842 B2 * | 4/2011 | Manack et al. | .............. | 257/678 |
| 8,030,823 B2 * | 10/2011 | Sinha et al. | ................... | 310/320 |
| 8,062,497 B2 * | 11/2011 | Witvrouw et al. | ............ | 205/118 |
| 2008/0157897 A1 * | 7/2008 | Tilmans et al. | ............... | 333/105 |
| 2010/0307786 A1 * | 12/2010 | Kohl et al. | ................ | 174/50.51 |
| 2011/0116661 A1 * | 5/2011 | Makihata et al. | ............. | 381/174 |

FOREIGN PATENT DOCUMENTS

| JP | 2007-222956 | 9/2007 |
|---|---|---|
| JP | 2008-137139 | 6/2008 |

* cited by examiner

*Primary Examiner* — Thomas L Dickey
*Assistant Examiner* — Joseph Schoenholtz
(74) *Attorney, Agent, or Firm* — Wenderoth, Lind & Ponack, L.L.P.

(57) ABSTRACT

In a MEMS element 500 where a MEMS structure 201 is hermetically sealed in a cavity 110 by a substrate 301 and laminated structure 120, interface sealing layers 101, 102 and 103 are provided between two layers that constitute the laminated structure 120, so as to prevent gas from breaking into the cavity 110 through the interface between two layers along the direction parallel to the surface of the substrate 301.

8 Claims, 8 Drawing Sheets

MEMS ELEMENT AND ELECTRICAL DEVICE USING THE SAME

BACKGROUND OF THE INVENTION

1. Field of the Invention

The present invention relates to a MEMS element and an electrical device using the same.

2. Description of the Related Art

Microelectromechanical systems (MEMS) are expected to be applied to many fields such as high-frequency/wireless, optics, acceleration sensors, biology and power. As for a MEMS element used as a resonator and the like, for example, MEMS resonators have been being developed. A MEMS resonator has advantages that it can be manufactured by a method that is compatible with semiconductor manufacturing method, which allows downsizing, integration and cost reduction comparing to conventional quartz resonators. Development of MEMS resonators is therefore expected as a technique that is supposed to greatly contribute to downsizing of resonators.

To put MEMS elements into practical use, sealing techniques are one of the important factors to be developed. Sealing techniques contribute to improvement of reliability of MEMS elements, and are important for maintaining the sealed internal atmosphere and protecting MEMS elements from external pollutants. With regard to MEMS resonators, for example, gas viscosity causes attenuation of the vibration energy (squeeze-film dumping), and the quality factor (Q factor), which represents sharpness of resonance, is decreased. In order to achieve a high Q factor, it is therefore required to vacuum-seal MEMS resonators, i.e. to keep the surroundings of MEMS resonators vacuum.

As mentioned above, MEMS elements often have a unique structure with a cavity, and specific sealing techniques have been being developed for MEMS elements. Such sealing techniques are broadly classified into bonding sealing by covering with a bonded cap substrate and thin-film sealing by covering with a thin film by thin film processing. The thin-film sealing can be performed by thin film processing that is continuous from the process of manufacturing MEMS elements, and is expected to reduce the cost of sealing techniques.

JP-A-2007-222956 discloses a sealing technique of forming a cavity by contacting with etching fluid at an opening of acid-resistant film such as silicon nitride film and then sealing the opening with resin or a board member.

JP-A-2008-137139 discloses a technique of forming a cavity by introducing etching fluid from a through hole of cavity forming film and then sealing it by forming sealing film of $SiO_2$, SiN or the like onto the whole cavity forming film.

SUMMARY OF THE INVENTION

An object of the present invention is to provide a MEMS element that maintains its hermetic condition for a long period, and thus has an extended lifecycle.

One of the aspects of the present invention is a MEMS element including:
a substrate;
a MEMS structure that is disposed on the substrate, and includes a flexible member; and
a laminated structure that is laminated on the substrate and includes a plurality of layers that define a cavity containing the MEMS structure;
wherein the MEMS structure is hermetically sealed in the cavity by the substrate and laminated structure; and
the laminated structure includes:
a support layer that defines a size and shape of the cavity in a direction parallel to a surface of the substrate;
a sealing layer that is disposed on a surface of the support layer, and includes an etching hole that was used to form the cavity;
a cap layer that is disposed on a surface of the sealing layer;
a porous layer that is disposed between the sealing layer and cap layer to cover the etching hole; and
an interface sealing layer that is disposed between the sealing layer and the porous layer in contact with the sealing layer and the porous layer, and is denser than any of the sealing layer and the porous layer.

According to one of the aspect of the present invention, a high hermeticity is maintained for a long period in MEMS elements having a sealed cavity, which allows an extended lifetime of the MEMS elements.

Figure 1:
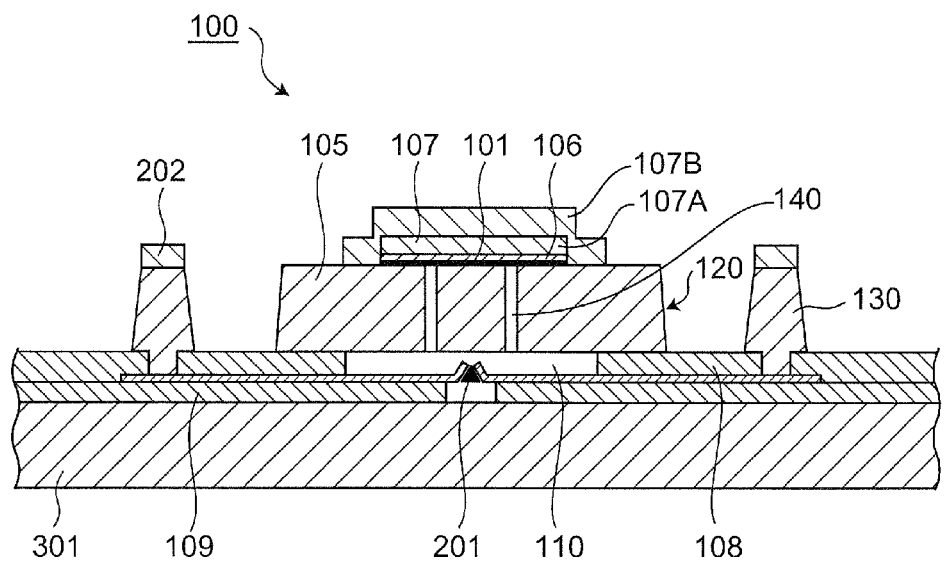
FIG. 1 is a cross sectional view showing the structure of a MEMS element of the first embodiment.

DESCRIPTION OF THE INVENTION (Details about how One Embodiment of the Present Invention has been Accomplished)

According to the techniques described in the background art, although it is possible to keep a hermetic condition for a short period, it is difficult to keep it for a long period. For example, even if a laminated structure is employed as the film that defines a cavity so as to increase its thickness, which is intended to prevent gas leak in the direction parallel to the thickness direction of the substrate, it is still difficult to maintain a hermetic condition sufficiently. As a result of the inventors' keen study for figuring out the cause, they found that the interface between the layers of the laminated structure was a leakage path of gas when the cavity is formed by the laminated structure consisting of a plurality of layers. Specifically, a layer of the laminated structure may have a large surface roughness originally from the time the layer is formed or as a result of an etching process that is given after the layer is formed. If another layer is formed on such layer having a large surface roughness, a minute space is formed on the interface, which is supposed to be the leakage path.

One of the embodiments of the present invention has been made on the basis of the above novel finding, and it is an object of the present invention to provide a MEMS element that maintains its hermetic condition for a long period, and thus has an extended lifetime.

(First Aspect)

First aspect of the present invention is directed to a MEMS element including:

a substrate;

a MEMS structure that is disposed on the substrate, and includes a flexible member; and a laminated structure that is laminated on the substrate, and includes a plurality of layers that define a cavity containing the MEMS structure;

wherein the MEMS structure is hermetically sealed in the cavity by the substrate and laminated structure; and the laminated structure includes:

a support layer that defines a size and shape of the cavity in a direction parallel to a surface of the substrate;

a sealing layer that is disposed on a surface of the support layer, and includes an etching hole that was used to form the cavity;

a cap layer that is disposed on a surface of the sealing layer;

a porous layer that is disposed between the sealing layer and cap layer to cover the etching hole; and an interface sealing layer that is disposed between the sealing layer and the porous layer in contact with the sealing layer and the porous layer, and is denser than any of the sealing layer and the porous layer.

The MEMS element of the first aspect has a feature that the laminated structure of sealing structure includes the sealing layer, the cap layer and the porous layer, and the interface sealing layer is disposed at the interface between the sealing layer and porous layer. The interface sealing layer prevents or reduces gas entry into the vacuum cavity through the interface between the sealing layer and the porous layer, and thus allows the laminated structure to maintain the hermeticity for a long time. As a result, according to the first aspect, an extended lifetime of the MEMS element is achieved.

(Second Aspect)

Second aspect is directed to the MEMS element according to the first aspect, wherein the interface sealing layer surrounds an outer rim of part of the sealing layer, which part communicates with the cavity, or an outer rim of an area including the part communicating with the cavity, in a view from a direction perpendicular to the substrate.

(Third Aspect)

Third aspect is directed to the MEMS element according to the first or second aspect, wherein the sealing layer and the porous layer each contain silicon.

Since gas leakage is likely to occur between layers containing silicon, if both sealing layer and porous layer contain silicon, the effect of the interface sealing layer is more remarkable. The layers containing silicon may contain silicon as either a simple substance or a form of compound.

(Fourth Aspect)

Fourth aspect is directed to the MEMS element according to the first or the second aspect, wherein the interface sealing layer contains one or plural materials selected from titanium oxide, tantalum oxide, aluminum oxide, silicon oxide, titanium nitride, tantalum nitride, titanium, silicon carbide, an alloy of aluminum and silicon germanium, and silicon nitride. These materials form a dense film.

(Fifth Aspect)

Fifth aspect is directed to the MEMS element according to any one of the first to the fourth aspects, further including another interface sealing layer that is disposed between the support layer and the sealing layer, and is denser than any of the support layer and the sealing layer.

(Sixth Aspect)

Sixth aspect is the MEMS element according to the fifth aspect, wherein the sealing layer is disposed on part of a surface of the support layer, and the surface of the support layer includes an area that is not covered with the sealing layer, and another sealing layer extends beyond the interface between the support layer and the sealing layer to cover the area of the surface of the support layer, which area is not covered with the sealing layer.

(Seventh Aspect)

Seventh aspect is directed to the MEMS element according to any one of the first to the sixth aspects, wherein the sealing layer is composed of two or more layers, and a gas shielding layer covers a side face of the sealing layer, which face is located between two faces of the sealing layer parallel to a surface the substrate.

(Eighth Aspect)

Eighth aspect is directed to an electrical device including the MEMS element according to any one of the first to the seventh aspects.

The embodiments of the present invention will be described below with reference to the accompanying drawings. In the drawings, the same elements or members are represented by the same reference numerals. In the following description, repetitive descriptions for the same elements or members may be omitted.

First Embodiment

Described herewith is the first embodiment having a structure that a MEMS structure 201 is sealed by a laminated structure 120 in combination with a substrate 301, and the laminated structure 120 includes support layers 108 and 109, a sealing layer 105, a porous layer 106 and a cap layer 107. In this embodiment, the interface sealing layer 101 is formed between the sealing layer 105 and the porous layer 106.

FIG. 1 is a cross sectional view showing a part of the MEMS element of the embodiment, specifically a sealing structure for the MEMS element. A MEMS element 100 shown in FIG. 1 includes the laminated structure 120, the MEMS structure 201 formed on the substrate 301, and a contact structure 130 on which an electrode pad 202 is formed. In the embodiment shown in the drawing, the MEMS structure includes a flexible member that is an approximate triangular cross-section beam and oscillates mechanically, and an electrode that is provided adjacent to the flexible member. The flexible member oscillates torsionally with its axis of rotation being approximately the center of gravity of the cross section.

The MEMS structure 201 is sealed by being covered with the thin films of the support layer 109, the support layer 108, the sealing layer 105 and the cap layer 107. A cavity 110 is formed inside the sealing structure. The support layers 108 and 109 have a function of supporting the flexible member and the electrode of the MEMS structure 201, and define the shape or size of the cavity 110 in the direction parallel to the surface of substrate 301. Given the sealing layer 105 is not formed, both support layers 108 and 109 define a space that is open to the opposite side of the substrate 301 side. The sealing layer 105 is provided in order to seal the space defined by the support layers 108 and 109 in the thickness direction of substrate 301. The sealing layer 105 includes a through hole 140 that is communicated with the cavity 110 as shown in the drawing. The through hole 140 is a hole that was used for forming the cavity 110 by sacrifice layer etching. The sealing layer 105 is made of, for example, a silicon-containing material. Specifically, it is made of silicon germanium, silicon nitride, or the like.

The porous layer 106 is provided in a region on the surface of the sealing layer 5, the region covering an area where the through hole 140 is formed. The cap layer 107 is disposed in the region on the surface of the sealing layer 105, the region covering the porous layer 106. As shown in the drawing, the cap layer 107 has a bilayer structure in which a lower layer 107A is provided on the surface of the porous layer 106 while an upper layer 107B is provided on an area larger than the porous layer 106 so that it partially contacts with the surface of the sealing layer 105.

The porous layer 106 is formed before forming the cavity 110. Etching gas passes through the porous layer 106 and through hole 140 and reacts with the materials of the support layers 108 and 109, and the cavity 110 is thus formed. The cap layer 107 is formed after forming the cavity 110. If the material (or the atoms that constitute the material) of the cap layer 107 enters into the cavity 110 during the formation of the cap layer 107, it may adhere to the MEMS structure 201 and impair the function of the MEMS element 100. The porous layer 106 is provided so as to prevent the material of the cap layer 107 from entering into the cavity 110. The material and film forming method of the porous layer 106 are selected so that it allows the passage of the etching gas for forming the cavity 110 but does not allow the passage of the material of the cap layer 107. The porous layer 106 is a porous film made of a silicon-containing material such as silicon germanium, or a material containing aluminum oxide, etc.

Figure 2A:
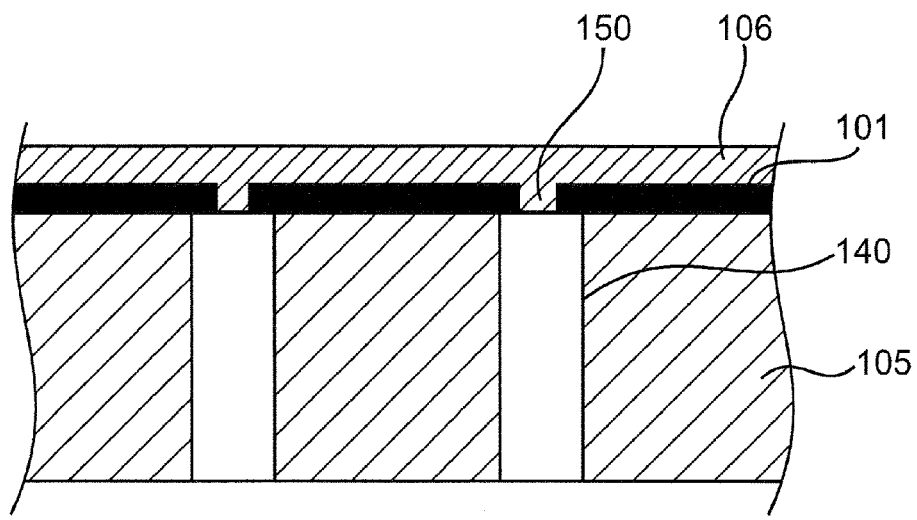
FIG. 2A is an enlarged cross sectional view of the MEMS element of the first embodiment showing the part of a sealing layer 105, an interface sealing layer 101 and a porous layer 106.

If the porous layer 106 is directly formed on the surface of the sealing layer 105, it does not closely contact with the sealing layer 105 because of its porosity. The interface between them is therefore likely to have a gas pathway (leakage path) through which gas passes in the direction parallel to the surface of the substrate 301. If gas breaks into the cavity 110 through such pathway, vacuum of the cavity 110 decreases. For example, if the MEMS element is a resonator, the Q factor decreases. To cope with that, in the embodiment, the interface sealing layer 101 is formed between the sealing layer 105 and the porous layer 106 so as to eliminate the gas pathway. FIG. 2A is an enlarged view showing the interface between the sealing layer 105 and the porous layer 106 where the interface sealing layer 101 is formed. A micropore 150 that allows the etching gas to pass therethrough are provided at a position immediately above the through hole 140 in the interface sealing layer 101. (The micropore 150 is not shown in FIG. 1 but only shown in FIG. 2A.) More specifically, the micropore 150 are formed after or during the formation of the interface sealing layer 101. If the porous layer 106 is formed by a thin film forming process that is used in semiconductor manufacturing or the like, the micropore 150 may be partially or fully filled with the material of the porous layer 106. (In FIG. 2A, the micropores 150 are fully filled with the material of the porous layer 106.)

Figure 2B:
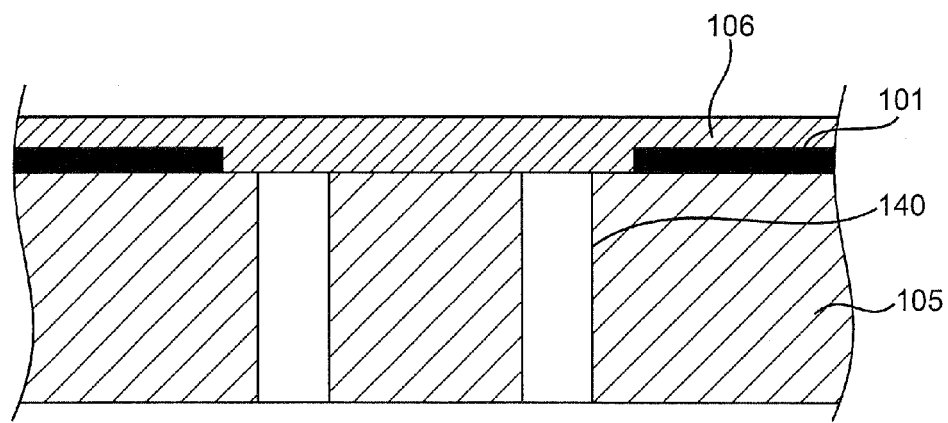
FIG. 2B is an enlarged cross sectional view of the MEMS element of a variation of the first embodiment showing the part of a sealing layer 105, an interface sealing layer 101 and a porous layer 106.

Alternatively, in a variation of the first embodiment, the interface sealing layer 101 may be formed to contact with the sealing layer 105 in the region excluding not only the parts immediately above the through holes 140 but also part surrounding the through holes 140. In other words, viewing from the direction perpendicular to the surface of the substrate 301, the interface sealing layer 101 may be formed to surround the outer rim of the area including the thorough holes 140 that are communicated with the cavity 110. For example, as shown in FIG. 2B, the interface sealing layer 101 is formed only on the peripheral part of the area where the sealing layer 105 and the porous layer 106 are overlapped with each other in the direction parallel to the surface of the substrate 301. This is because the through hole(s) is normally formed on a center part of the sealing layer 105. Even when the interface sealing layer 101 is located to surround the outer rim of the center area including the through holes 140, the gas leakage is prevented. The region where the interface sealing layer 101 is not formed may be fully or partially filled with the material of the porous layer 106.

The interface sealing layer 101 is a layer denser than any of the sealing layer 105 and the porous layer 106. "A layer denser than any of the sealing layer 105 and the porous layer 106" means a layer that suppresses the entry of gas into the cavity when it is disposed between the sealing layer 105 and porous layer 106 in contact with both of the layers, comparing with the case where such layer is not disposed between the sealing layer 105 and porous layer 106. The dense layer is made of a material that has fewer defects when it is formed into a film. For example, it has fewer crystal defects or fewer gaps at the interfaces between grains when it is formed into a film.

Specifically, it is preferable that the interface sealing layer 101 includes or substantially consists of one or more materials selected from titanium oxide, tantalum oxide, aluminum oxide, silicon oxide, titanium nitride, tantalum nitride, titanium, silicon carbide, an alloy of aluminum and silicon germanium, and silicon nitride. The word "substantially consist of" means that the other elements may be contained in the level of impurities. If plural materials are used, they may be laminated in structure. These materials are likely to form a dense layer, in particular a layer denser than layers containing silicon. Therefore, the interface sealing layer 101 may include or substantially consist of one or more materials selected from these materials. For example, the layer may be a laminated film of titanium/titanium nitride, if both sealing layer 105 and porous layer 106 contain silicon (Si). The laminated film of titanium/titanium nitride is strong and dense.

The thickness of the interface sealing layer 101 is not particularly limited. For example, it may be 1 nm to 1 μm, and particularly 10 nm to 100 nm. The interface sealing layer 101 having a thickness within this range effectively prevent gas from breaking into the cavity 110.

Figure 8:
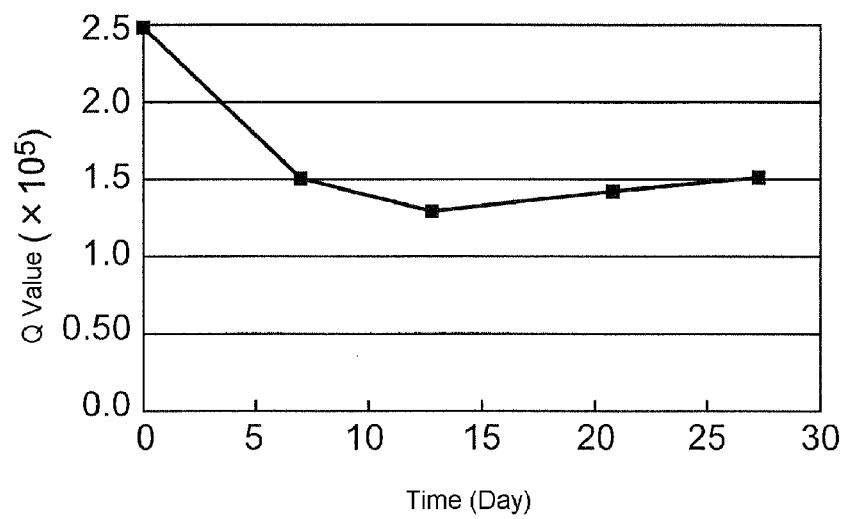
FIG. 8 is a graph showing an aging change of Q factor of the MEMS element of the first embodiment.

FIG. 8 is a graph showing hermeticity of the sealing structure for the MEMS element that is employed in the present first embodiment. FIG. 8 shows a test data representing an aging change of the Q factor of the MEMS element having a structure shown in FIG. 1 where it is stored in the atmosphere of a relative humidity of 85% and a temperature of 85° C. Since the Q factor decreases as the hermeticity decreases and gas breaks into the cavity, it is possible to estimate the aging change of the hermeticity from the aging change of the Q factor. Since the MEMS element maintains a high Q factor (150,000) for about one month, it can maintain high hermeticity for a long period of time. As a result, extension of the lifetime of the MEMS element is achieved according to the above structure.

The test was conducted using the MEMS element having a structure as shown in FIG. 1, in which the sealing layer 105 is 4 μm thick silicon germanium, the porous layer 106 is silicon germanium, and the interface sealing layer 101 is a titanium/titanium nitride laminated film having 5 nm/10 nm thickness. In the MEMS element, the MEMS structure 201 included a flexible member that had an approximate triangular cross section of about 6.4 μm$^2$, and the cavity 110 had a volume about 13,200 μm$^3$. A MEMS element having the same structure except that the interface sealing layer 101 was not provided had such a deteriorated property that the Q factor became difficult to measure after 30 days, when it was stored in the same condition.

The MEMS element 100 as shown in FIG. 1 may be manufactured by a thin film forming process (sputtering, CVD, deposition, etc.) and a patterning process, which are used in semiconductor manufacturing and the like. The steps are as shown in FIGS. 9A to 9E. However, FIGS. 9A to 9E show a manufacturing method of a MEMS element that includes interface sealing layers not only between a sealing layer 105 and a porous layer 106 but also between the other layers, i.e. includes the components that are not shown in FIG. 1 (specifically, the MEMS element of the seventh embodiment described below). In the manufacture of the MEMS element shown in FIG. 1, the layers that are represented by reference numerals 102, 103 and 104 in FIGS. 9A to 9E are not formed. Reference numeral 1051 in FIGS. 9A to 9E refers an interface that is formed if the sealing layer 105 is a bilayer.

Specifically, the support layer 109, the MEMS structure 201 and the support layer 108 are successively formed onto the substrate 301 in this order, and then the support layers 108 and 109 are patterned by a process such as photolithography and etching. By the patterning, an opening is formed for forming the contact structure that electrically connects the MEMS structure 201 with an external component. The substrate 301 is made of silicon or the like, and the support layers 108 and 109 are made of silicon oxide or the like.

Figure 9A:
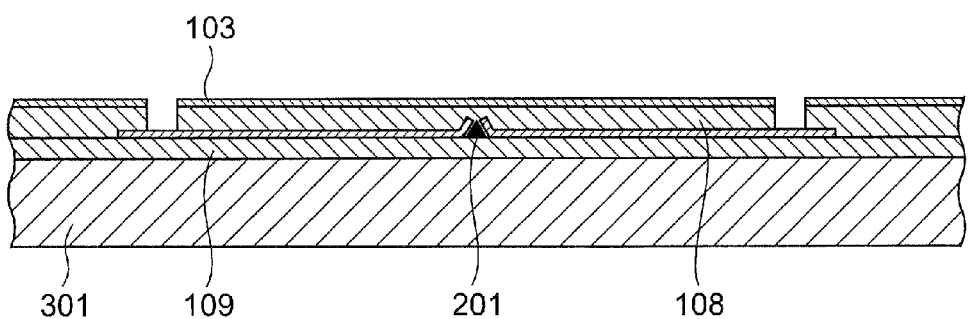
FIG. 9A is a cross sectional view showing a manufacturing step of the MEMS element of the seventh embodiment.
Figure 9B:
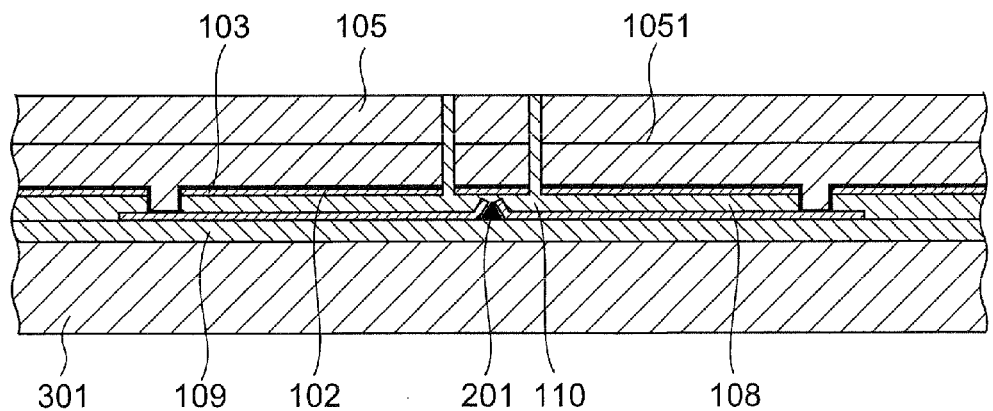
FIG. 9B is a cross sectional view showing a manufacturing step of the MEMS element of the seventh embodiment.

Next, the sealing layer 105 is formed. The sealing layer 105 may be of a monolayer or laminated structure. If the sealing layer 105 has a laminated structure, two or more layers made of the same material may be laminated. For example, if the sealing layer 105 is formed to be a thick layer, thin layer forming processes may be carried out repeatedly. The layer that is formed by repeated thin layer forming processes generally has a higher quality than one of the same thickness that is formed by a single process. Next, the through hole is formed on the sealing layer 105, and is then filled with the same material as the support layers 108 and 109. FIG. 9B shows the state where the through hole is filled with the same material as the support layers 108 and 109.

Figure 9C:
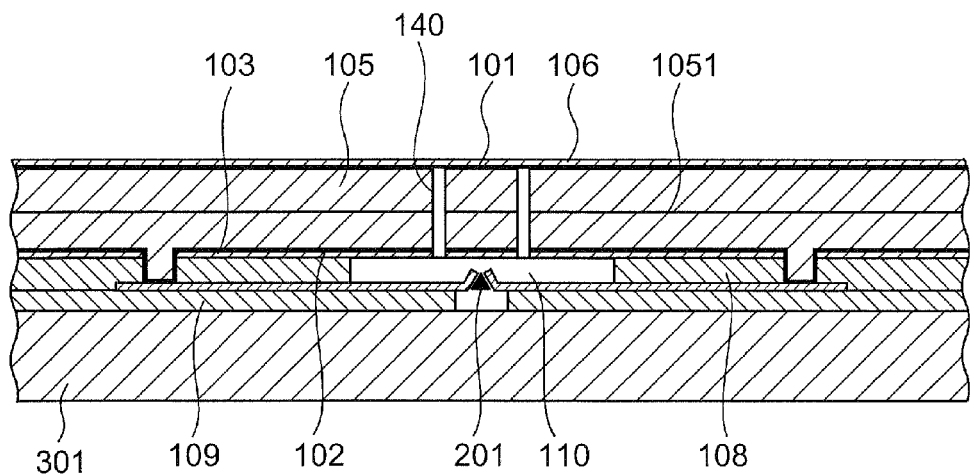
FIG. 9C is a cross sectional view showing a manufacturing step of the MEMS element of the seventh embodiment.

Next, as shown in FIG. 9C, the interface sealing layer 101 and the porous layer 106 are formed, and then part of the support layers 108 and 109 are removed by sacrifice layer etching to form the cavity 110. Removal of part of the support layers 108 and 109 (the part to be removed is the sacrifice layer that becomes the cavity 110) is conducted by a method wherein etchant is introduced from an etching hole through the porous layer 106 and the part of the support layers 108 and 109 that surrounds the MEMS structure 201 is etched.

After the cavity 110 is formed, the lower layer 107A of the cap layer 107 is formed. After the lower layer 107A is formed, the interface sealing layer 101, the porous layer 106 and the lower layer 107A are patterned by a process such as photolithography and etching. The atmosphere of the cavity 110 is controlled by the method of forming the cap layer 107 (the lower layer 107A of the cap layer 107 in the figure). The cap layer 107 is made of metal such as aluminum, and is formed by sputtering. In this case, it is possible to make a high vacuum condition of about 1 Pa argon in the cavity 110. The MEMS structure 201 is sealed in the cavity 110 under this condition. By patterning, the interface sealing layer 101 is removed from the area other than the interface between the sealing layer 105 and the porous layer 106. Part of the area where the interface sealing layer 101 and the porous layer 106 are removed constitute the contact structure 130 as described below, which makes a good contact with the electrode pad 202.

Figure 9D:
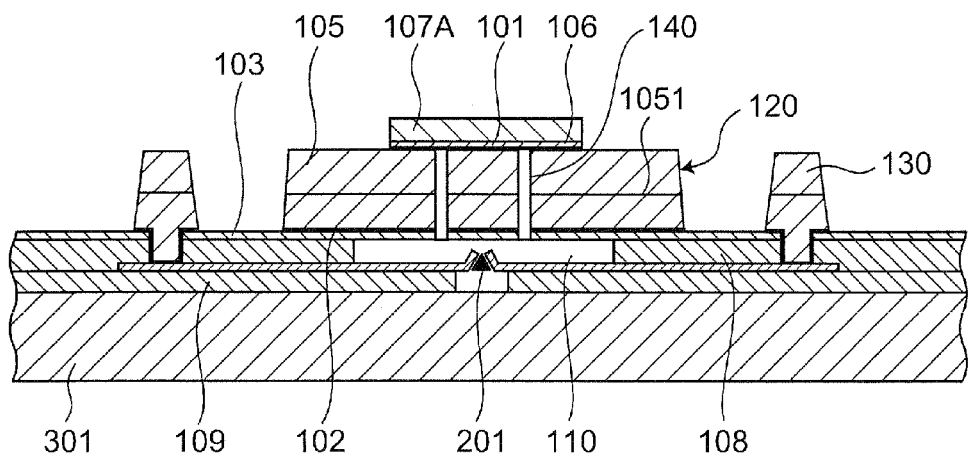
FIG. 9D is a cross sectional view showing a manufacturing step of the MEMS element of the seventh embodiment.

Next, the sealing layer 105 is patterned by a process such as photolithography and etching to separate the laminated structure 120, which functions as a sealing member, from the contact structure 130 to which the electrode pad is formed. FIG. 9D shows the state after the patterning.

Figure 9E:
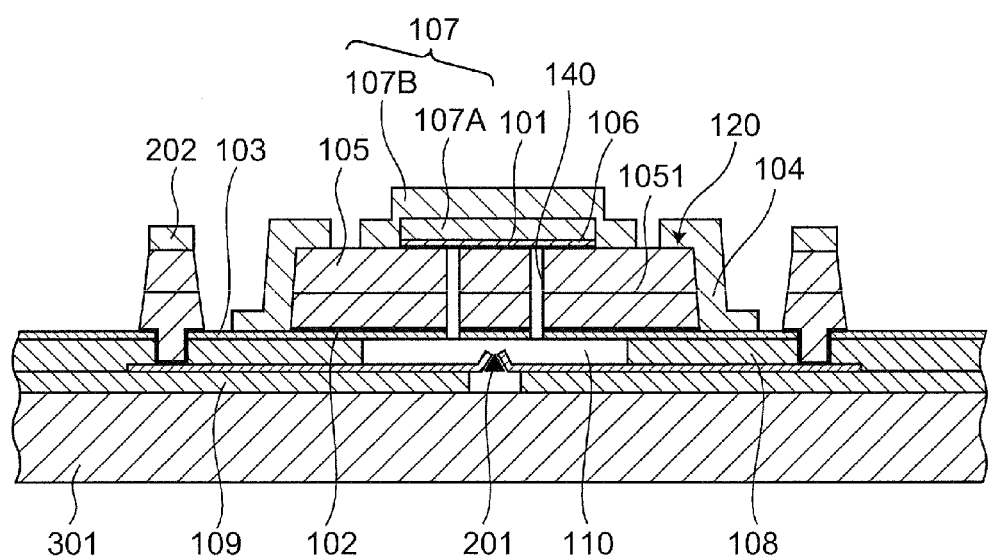
FIG. 9E is a cross sectional view showing a manufacturing step of the MEMS element of the seventh embodiment.

Next, the electrode pad 202 is formed by a thin layer forming process using a conductive material, photolithography process and etching process. FIG. 9E shows the state where the electrode pad 210 is formed. The upper layer 107B of the cap layer 107 and the electrode pad 202 are formed simultaneously. The upper layer 107B of the cap layer 107 is formed onto an area broader than the lower layer 107A. As described above, the MEMS element of FIG. 1 does not contain the component represented by reference numeral 104 in FIG. 9E (a gas shielding layer described below), and this component is thus not formed.

Second Embodiment

Described herewith is the second embodiment having a structure wherein a MEMS structure 201 is sealed by a laminated structure 120 in combination with a substrate 301, and the laminated structure 120 includes support layers 108 and 109, a sealing layer 105, a porous layer 106 and a cap layer 107. The present embodiment includes an interface sealing layer 1011 that is formed between the sealing layer 105 and the cap layer 107, in addition to an interface sealing layer 101 that is formed between the sealing layer 105 and the porous layer 106.

Figure 3:
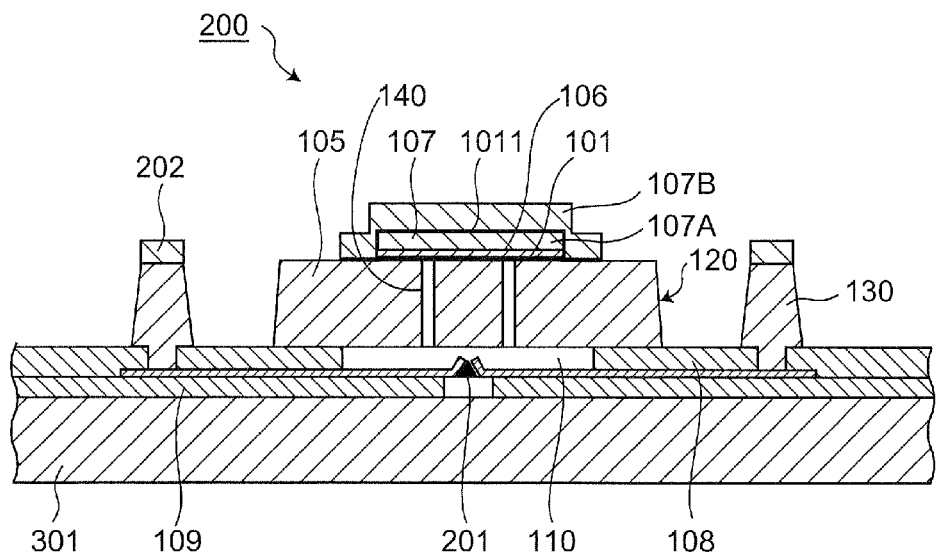
FIG. 3 is a cross sectional view showing the structure of a MEMS element of the second embodiment.

FIG. 3 is a cross sectional view showing a part of a MEMS element 200 of the present embodiment, specifically a sealing structure for the MEMS element. The MEMS element 200 shown in FIG. 3 has the same structure as the MEMS element 100 shown in FIG. 1, except that the interface sealing layer 1011 is formed in addition to the interface sealing layer 101. The interface sealing layer 1011 is formed at the interface between the sealing layer 105 and the cap layer 107, and prevents a gas pathway (leakage path) from being formed between the sealing layer 105 and the cap layer 107 along the direction parallel to the surface of the substrate 301. As described below, since the interface sealing layer 1011 is formed after forming the lower layer 107A of the cap layer and before forming the upper layer 107B of the cap layer, it is disposed also between the lower layer 107A and upper layer 107B.

The interface sealing layer 1011 is denser than any of the sealing layer 105 and the cap layer 107, and may contain or substantially consists of one or more of the materials that are exemplified for the interface sealing layer 101 in the first embodiment. For example, if the sealing layer 105 is made of silicon germanium and the cap layer 107 is made of aluminum, the interface sealing layer 1011 may be a laminated film of titanium/titanium nitride which is dense and strong.

The thickness of the interface sealing layer 1011 is not particularly limited. For example, it may be 1 nm to 1 μm, and particularly 10 nm to 100 nm. The interface sealing layer 1011 having a thickness within this range effectively prevents gas from breaking into the cavity 110.

The MEMS element 200 as shown in FIG. 3 may be manufactured by a thin film forming process and patterning process, which are used in semiconductor manufacturing and the like. Specifically, the MEMS element 200 may be manufactured by almost the same process as described in the first embodiment. The interface sealing layer 1011 is formed after forming the lower layer 107A of the cap layer 107 and patterning the interface sealing layer 101, the porous layer 106 and the lower layer 107A by a process such as photolithography and etching. At the time point immediately after forming the interface sealing layer 1011, the layer 1011 is formed on the surface of the lower layer 107A of the cap layer 107, the surface of the sealing layer 105 and the surface of the contact structure 130 of FIG. 9D. The interface sealing layer 1011 is patterned before forming the upper layer 107B of the cap layer 107 so that it only covers a desired area.

Third Embodiment

Described herewith is the third embodiment having a structure wherein a MEMS structure 201 is sealed by a laminated structure 120 in combination with a substrate 301, and the laminated structure 120 includes support layers 108 and 109 and a sealing layer 105. The present embodiment includes an interface sealing layer 102 that is formed between the support layer 108 and the sealing layer 105, in addition to an interface sealing layer 101 that is formed between the sealing layer 105 and a porous layer 106.

Figure 4:
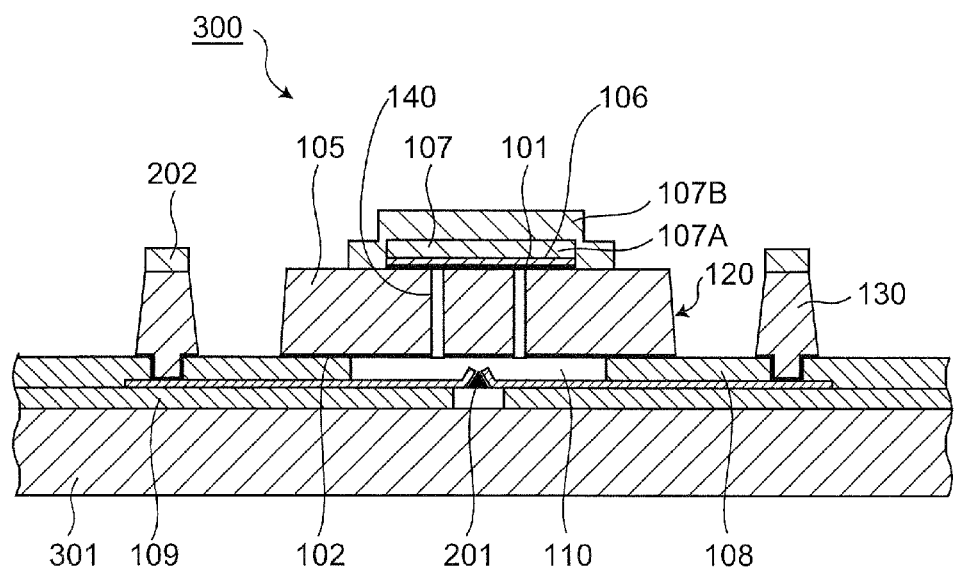
FIG. 4 is a cross sectional view showing the structure of a MEMS element of the third embodiment.

FIG. 4 is a cross sectional view showing a part of the MEMS element 300 of the present embodiment, specifically a sealing structure for the MEMS element. The MEMS element 300 shown in FIG. 4 has the same structure as the MEMS element 100 shown in FIG. 1, except that the interface sealing layer 102 is provided in addition to the interface sealing layer 101. The interface sealing layer 102 is formed at the interface between the support layer 108 and the sealing layer 105, and prevents a gas pathway (leakage path) from being formed between the support layer 108 and the sealing layer 105 along the direction parallel to the surface of the substrate 301. As described below, since the interface sealing layer 102 is formed after forming the support layers 108 and 109 and further forming an opening for the contact structure 130, it is also disposed between the contact structure 130 and the support layer 108.

The interface sealing layer 102 is denser than any of the support layer 108 and the sealing layer 105, and may contain or substantially consist of one or more of the materials that are exemplified for the interface sealing layer 101 in the first embodiment. The interface sealing layer 102 may be made of a conductive material, since it is in contact with an electrode and the contact structure 130 of the MEMS structure 201 as shown in the drawing. For example, if the support layer 108 is made of silicon oxide, and the sealing layer 105 is made of silicon germanium, the material of the interface sealing layer 102 may be a laminated film of titanium/titanium nitride which is dense and strong.

The thickness of the interface sealing layer 102 is not particularly limited. For example, it may be 1 nm to 1 μm, and particularly 10 nm to 100 nm. The interface sealing layer 102 having a thickness within this range effectively prevents gas from breaking into the cavity 110.

The MEMS element 300 as shown in FIG. 4 may be manufactured by a thin film forming process and patterning process, which are used in semiconductor manufacturing and the like. Specifically, the MEMS element 300 may be manufactured by almost the same process as described in the first embodiment. The interface sealing layer 102 is formed after forming the opening for the contact structure 130. During patterning the sealing layer 105, the interface sealing layer 102 is removed from the surface of the support layer 108 that locates between the laminate structure 120 and the contact structure 130, and is thus located only at the interface between the two layers as shown in FIG. 9D.

Fourth Embodiment

Described herewith is the fourth embodiment having a structure wherein a MEMS structure 201 is sealed by a laminated structure 120 in combination with a substrate 301, the laminated structure 120 includes support layers 108 and 109 and a sealing layer 105, and an interface sealing layer 103 is provided between the support layer 108 and the sealing layer 105 and covers the surface of the support layer 108. The present embodiment includes the interface sealing layer 103 that is formed between the support layer 108 and the sealing layer 105, in addition to an interface sealing layer 101 that is formed between the sealing layer 105 and a porous layer 106.

Figure 5:
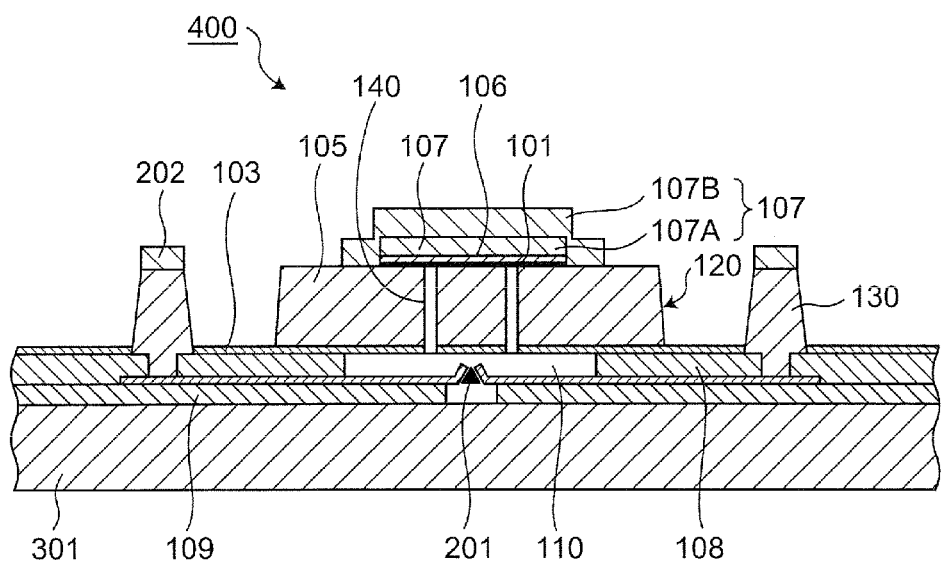
FIG. 5 is a cross sectional view showing the structure of a MEMS element of the fourth embodiment.

FIG. 5 is a cross sectional view showing a part of the MEMS element 400 of the present embodiment, specifically a sealing structure for the MEMS element. The MEMS element 400 shown in FIG. 5 has the same structure as the MEMS element 100 shown in FIG. 1, except that the interface sealing layer 103 is provided in addition to the interface sealing layer 101. The interface sealing layer 103 is formed at the interface between the support layer 108 and the sealing layer 105, and prevents a gas pathway (leakage path) from being formed between the support layer 108 and sealing layer 105 along the direction parallel to the surface of the substrate 301. The interface sealing layer 103 extends beyond the interface between the support layer 108 and sealing layer 105 to cover the part of the surface of the support layer 108, the part being not covered with the sealing layer 105.

The gas may pass inside the support layers 108 and 109, which define the size and shape of the cavity 110 in the direction parallel to the surface of the substrate 301. Specifically, gas may penetrate from the surface of the support layer 108, pass through inside the support layers 108 and 109, and eventually reach the cavity 110. It is needless to say that the hermeticity of the cavity 110 deteriorates in this case. Such infiltration of gas is effectively prevented by the interface sealing layer 103 that is located on the surface of the support layer 108.

The interface sealing layer 103 may contain or substantially consists of one or more of the materials that are exemplified for the interface sealing layer 101 in the first embodiment. As shown in the drawing, the interface sealing layer 103 may be continuous from the laminated structure 120 to the contact structure 130. In this case, the interface sealing layer 103 may be made of an insulating material so as to electrically separate the laminated structure from the contact structure 130. For example, the layer 103 may be made of silicon carbide which is dense and strong among insulating materials.

The thickness of the interface sealing layer 103 is not particularly limited. For example, it may be 1 nm to 1 μm, and particularly 100 nm to 500 nm. The interface sealing layer 103 having a thickness within this range effectively prevents gas from breaking into the cavity 110.

The MEMS element 400 as shown in FIG. 5 may be manufactured by a thin film forming process and patterning process, which are used in semiconductor manufacturing and the like. Specifically, the MEMS element 400 may be manufactured by almost the same process as described in the first embodiment. The interface sealing layer 103 is formed after forming the support layer 108. As shown in FIG. 9A, an opening for the contact structure 130 is formed after forming the interface sealing layer 103.

Fifth Embodiment

Described herewith is the fifth embodiment, which is an variation of the first embodiment, having a structure wherein an interface sealing layer 101 is formed between a sealing layer 105 and a porous layer 106, a sealing layer 105 consists of two layers, and the side face of the sealing layer 105 is covered with a gas shielding layer 104.

Figure 6A:
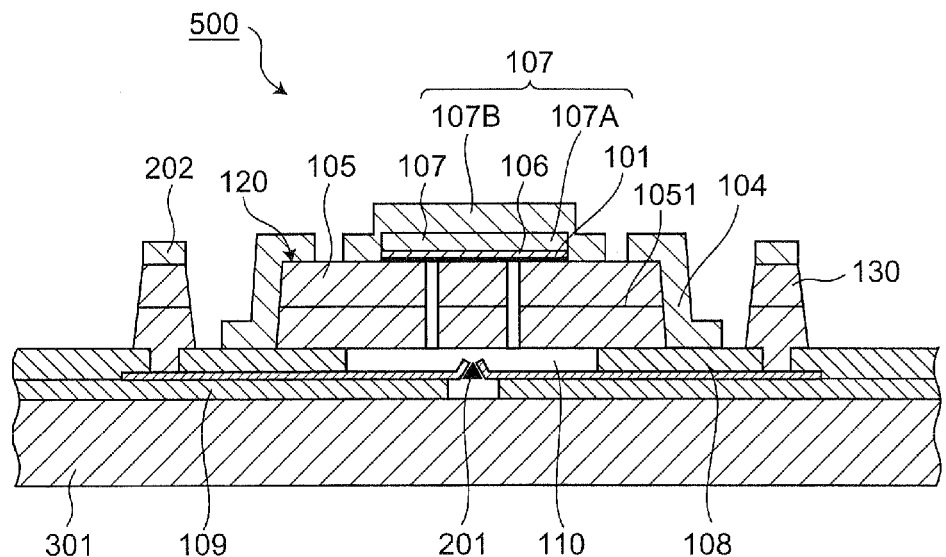
FIG. 6A is a cross sectional view showing the structure of a MEMS element of the fifth embodiment.

FIG. 6A is a cross sectional view showing a part of the MEMS element 500 of the present embodiment, specifically a sealing structure for the MEMS element. The MEMS element 500 shown in FIG. 6A has the same structure as the MEMS element 100 shown in FIG. 1, except that the sealing layer 105 consists of two layers and the gas shielding layer 104 is provided on the side face of the sealing layer 105. The side face of the sealing layer 105 is located between the two faces that define the sealing layer 105 in the direction parallel to the surface of the substrate 301. The sealing layer 105 consists of two layers of the same material so as to achieve a large thickness and good film quality.

When the sealing layer 105 consists of a plurality of layers of the same material and a layer of another material is formed at the interface 1051 between these layers, it may be difficult to make a thick film while retaining the integrity of the film. When the sealing layer 105 consists of a plurality of layers, it may be therefore preferable to cover the part where the interface is exposed, with the material that does not allow gas to pass therethrough easily, rather than to form an interface sealing layer between the layers. Also, gas may pass through inside the sealing layer 105 to break into the cavity 110. The gas shielding layer 104 prevents gas from breaking into the cavity 110 through an interface 1051 and interior of the sealing layer 105. The gas shielding layer 104 makes the hermetical sealing of the cavity 110 more favorably, which further extends the lifetime of the MEMS element 500.

In the embodiment, the side face of the sealing layer 105 may be inclined as shown in the drawing. In this case, the gas shielding layer 104 is formed as a uniform layer.

The gas shielding layer 104 may be made of a material that prevents or reduces entry of external gas. Specifically, the gas shielding layer 104 may contain or substantially consists of one or more materials that are exemplified for the interface sealing material 101 in the first embodiment, or a metallic material (for example, aluminum or an alloy of aluminum and silicon germanium). If an electrode pad 202 is made of aluminum, for example, the gas shielding layer 104 may be also made of aluminum. By using the same material for the electrode pad 202 and gas shielding layer 104, they can be formed in the same process, simplifying the manufacturing process. The gas shielding layer 104 may be provided in the MEMS elements of the other embodiments (for example, the above-mentioned first to fourth embodiments)

The MEMS element 500 as shown in FIG. 6A may be manufactured by a thin film forming process and patterning process, which are used in semiconductor manufacturing and the like. Specifically, the MEMS element 500 may be manufactured by almost the same process as described in the first embodiment. The gas shielding layer 104 may be formed simultaneously with the upper layer 107B of the cap layer and electrode pad 202.

Sixth Embodiment

Described herewith is the sixth embodiment in which a MEMS element includes an interface sealing layer 1055 in addition to an interface sealing layer 101. Specifically in the sixth embodiment, a MEMS structure 201 is sealed by a substrate 301 and a laminated structure 120; the laminated structure 120 includes support layers 108 and 109 and a sealing layer 105; the sealing layer 105 consists of two layers 105A and 105B; and the interface sealing layer 1055 is provided between the two layers 105A and 105B that constitute the sealing layer 105, as shown in FIG. 6B.

Figure 6B:
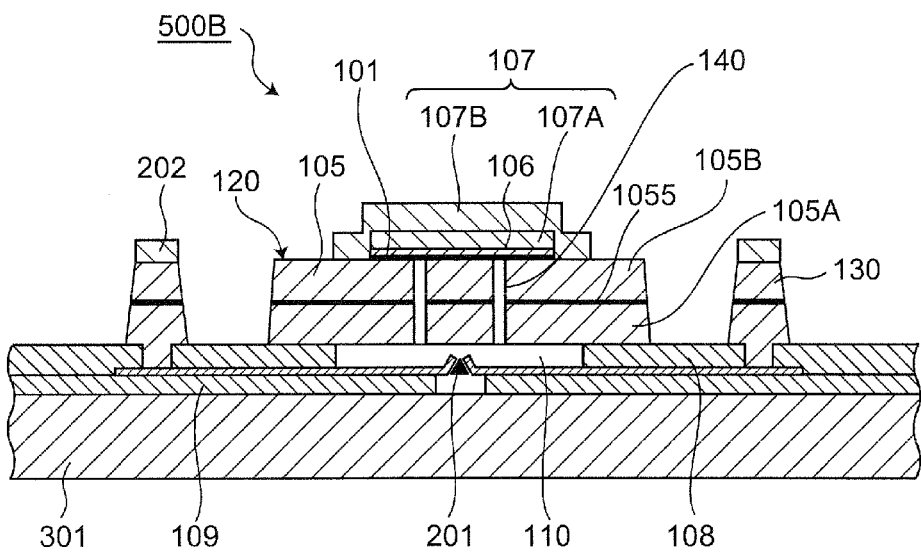
FIG. 6B is a cross sectional view showing the structure of a MEMS element of the sixth embodiment.

FIG. 6B is a cross sectional view showing a part of a MEMS element 500B, specifically a sealing structure for the MEMS element. The MEMS element shown in FIG. 6 have the same structure as the element shown in FIG. 1, except that the sealing layer 105 consists of the two layers 105A and 105B and the interface sealing layer 1055 is provided, in addition to an interface sealing layer 101. The interface sealing layer 1055 is formed at the interface between the two layers 105A and 105B constituting the sealing layer 105, and prevents a gas pathway (leakage path) from being formed between these layers along the direction parallel to the surface of the substrate 301. The interface sealing layer 1055 is particularly effective if the sealing layer 105 consists of a plurality of layers of different materials.

The interface sealing layer 1055 is denser than any of the two layers 105A and 105B constituting the sealing layer 105, and may contain or substantially consist of one or more materials that are exemplified for the interface sealing layer 101 in the first embodiment. For example, if both of the two layers constituting the sealing layer 105 are made of silicon germanium, the layer 105 may be a laminated film of titanium/titanium nitride, which is dense and strong.

The thickness of the interface sealing layer 1055 is not particularly limited. For example, it may be 1 nm to 1 μm, and particularly 10 nm to 100 nm. The interface sealing layer 1055 having a thickness within this range effectively prevents gas from breaking into a cavity 110.

The MEMS element 500B as shown in FIG. 6B may be manufactured by a thin film forming process and patterning process, which are used in semiconductor manufacturing and the like. Specifically, the MEMS element 500B may be manufactured by almost the same process as described in the first embodiment. The interface sealing layer 1055 is formed after forming the lower sealing layer.

Seventh Embodiment

Figure 7:
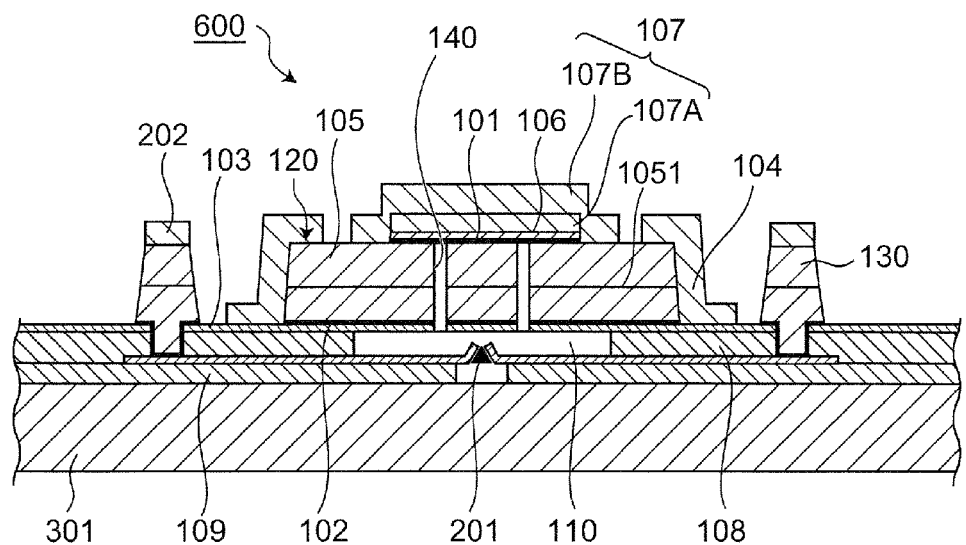
FIG. 7 is a cross sectional view showing the structure of a MEMS element of the seventh embodiment.

Described herewith is the seventh embodiment having a structure including interface sealing layers 101, 102 and 103 and a gas shielding layer 104 that are described in the first, the third, the fourth and the fifth embodiments. FIG. 7 is a cross sectional view showing a part of a MEMS element 600 of the present embodiment, specifically a sealing structure for the MEMS element.

The interface sealing layers 101, 102 and 103 and the gas shielding layer 104 are as described in the first, the third, the fourth and the fifth embodiments, and the description thereto are omitted here. The present embodiment includes more interface sealing layers, and thus maintains more favorable hermetical sealing of a cavity 110. As a result, the lifetime of the MEMS element is further extended.

The MEMS element 600 shown in FIG. 7 may be manufactured by a thin film forming process and etching process, which are used in semiconductor manufacturing and the like. Specifically, it is manufactured according to the process shown in FIGS. 9A to 9E. The methods of forming respective layers are as described in the first, the third, the fourth and the fifth embodiments, and the descriptions thereto are omitted here.

The present invention is not limited to the first to the seventh embodiments. As one of the other embodiments, a MEMS structure may include a flexible member that vibrates in the thickness direction of a substrate, and an electrode that is located adjacent to the flexible member. A combination of two or more of the first to the sixth embodiments is also possible.

The MEMS elements of the first to the seventh embodiments can be applied to, for example, devices such as switching elements, resonators, filters, oscillators, gyroscopes, pressure sensors and mass detecting elements, and electronic devices using them. Electronic devices include, for example, cellular phones.

All of the embodiments of the present invention can be applied to MEMS elements having a structure wherein a MEMS structure is disposed in a highly hermetically-sealed cavity. For example, they are applicable as MEMS resonators, MEMS oscillators and MEMS pressure sensors.

What is claimed is:

1. A MEMS element comprising:
   a substrate;
   a MEMS structure that is disposed on the substrate, and includes a flexible member; and
   a laminated structure that is laminated on the substrate, and includes a plurality of layers that define a cavity containing the MEMS structure;
   wherein the MEMS structure is hermetically sealed in the cavity by the substrate and laminated structure; and
   the laminated structure comprises:
   a support layer that defines a size and shape of the cavity in a direction parallel to a surface of the substrate;
   a sealing layer that is disposed on a surface of the support layer, and comprises an etching hole that was used to form the cavity;
   a cap layer that is disposed on a surface of the sealing layer;
   a porous layer that is disposed between the sealing layer and cap layer to cover the etching hole; and
   an interface sealing layer that is disposed between the sealing layer and the porous layer in contact with the sealing layer and the porous layer, and is denser than any of the sealing layer and the porous layer.

2. The MEMS element according to claim 1, wherein the interface sealing layer surrounds an outer rim of part of the sealing layer, which part communicates with the cavity, or an outer rim of an area including the part communicating with the cavity, in a view from a direction perpendicular to the substrate.

3. The MEMS element according to claim 1, wherein the sealing layer and the porous layer each comprises silicon.

4. The MEMS element according to claim 1, wherein the interface sealing layer comprises one or more materials selected from titanium oxide, tantalum oxide, aluminum oxide, silicon oxide, titanium nitride, tantalum nitride, titanium, silicon carbide, an alloy of aluminum and silicon germanium, and silicon nitride.

5. The MEMS element according to claim 1, further comprising another interface sealing layer that is disposed between the support layer and the sealing layer, and is denser than any of the support layer and the sealing layer.

6. The MEMS element according to claim 5, wherein the sealing layer is disposed on part of a surface of the support layer, and the surface of the support layer includes an area that is not covered with the sealing layer, and
   another sealing layer extends beyond the interface between the support layer and the sealing layer to cover the area of the surface of the support layer, which area is not covered with the sealing layer.

7. The MEMS element according to claim 1, wherein the sealing layer is composed of two or more layers, and
   a gas shielding layer covers a side face of the sealing layer, which face is located between two faces of the sealing layer parallel to a surface the substrate.

8. An electrical device comprising the MEMS element according to claim 1.

\* \* \* \* \*